(12) United States Patent
Motoda

(10) Patent No.: US 9,041,197 B2
(45) Date of Patent: May 26, 2015

(54) SEMICONDUCTOR DEVICE

(71) Applicant: Mitsubishi Electric Corporation, Tokyo (JP)

(72) Inventor: Takashi Motoda, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/482,422

(22) Filed: Sep. 10, 2014

(65) Prior Publication Data

US 2014/0374770 A1   Dec. 25, 2014

Related U.S. Application Data

(62) Division of application No. 13/742,459, filed on Jan. 16, 2013, now abandoned.

(30) Foreign Application Priority Data

May 10, 2012   (JP) ................. 2012-108513

(51) Int. Cl.
*H01L 23/34* (2006.01)
*H01L 33/32* (2010.01)
*H01L 23/492* (2006.01)
*H01L 23/373* (2006.01)
*H01S 5/022* (2006.01)
*H01L 33/30* (2010.01)
*H01L 33/48* (2010.01)
*H01S 5/30* (2006.01)
*H01S 5/024* (2006.01)

(52) U.S. Cl.
CPC ............ *H01L 33/32* (2013.01); *H01L 23/4924* (2013.01); *H01L 23/3733* (2013.01); *H01L 23/3736* (2013.01); *H01S 5/02236* (2013.01); *H01S 5/02272* (2013.01); *H01S 5/02476* (2013.01); *H01L 2224/48091* (2013.01); *H01L 2224/48465* (2013.01); *H01L 2224/73265* (2013.01); *H01L 33/30* (2013.01); *H01L 33/486* (2013.01); *H01S 5/3013* (2013.01); *H01L 2924/1305* (2013.01)

(58) Field of Classification Search
CPC ..... H01L 23/373; H01L 23/345; H01L 23/36; H01L 23/3732; H01L 23/40; H01L 33/32; H01L 33/30; H01L 33/486
USPC ................................... 257/98, 675, 720, 796
See application file for complete search history.

(56) References Cited

U.S. PATENT DOCUMENTS

2004/0217362 A1   11/2004   Slater, Jr. et al.
2005/0067636 A1   3/2005   Amoh et al.
(Continued)

FOREIGN PATENT DOCUMENTS

JP   60-92686 A   5/1985
JP   2001-24102 A   1/2001
(Continued)

*Primary Examiner* — Tan N Tran
(74) *Attorney, Agent, or Firm* — Leydig, Voit & Mayer, Ltd.

(57) ABSTRACT

A semiconductor device includes a semiconductor element having a substrate of GaAs, InP, or GaN, and an element securing member bonded to the semiconductor element by solder. The element securing member is a composite material of Cu and carbon or a composite of Al and carbon. A stem is connected to the element securing member, and a cap is secured to the stem. The cap covers the semiconductor element and the element securing member. The stem and the element securing member are made of the same material.

6 Claims, 10 Drawing Sheets

(56) References Cited

U.S. PATENT DOCUMENTS

2008/0315401 A1 12/2008 Imamura et al.
2010/0219419 A1 9/2010 Hata et al.
2011/0027603 A1 2/2011 Yaniv et al.

FOREIGN PATENT DOCUMENTS

| JP | 2002-232052 A | 8/2002 |
| JP | 2006-41214 A | 2/2006 |
| JP | 2006-86391 A | 3/2006 |
| JP | 2007-103685 A | 4/2007 |
| JP | 2009-63632 A | 3/2009 | understand

SEMICONDUCTOR DEVICE

BACKGROUND OF THE INVENTION

1. Field of the Invention

The present invention relates to a semiconductor device for use in, e.g., optical disc drives, displays, and optical communications, etc.

2. Background Art

Japanese Laid-Open Patent Publication No. S60-92686 discloses a semiconductor device in which a semiconductor laser element is mounted on a submount. This submount is formed of an alloy of W and Cu, an alloy of Mo and Cu, or an alloy of W, Mo, and Cu. The coefficient of thermal expansion of the submount is substantially equal to that of the semiconductor laser element, which is formed of InP, etc.

It is desirable that a submount does not cause excessive stress on the semiconductor element mounted thereon even at high temperatures and, furthermore, that it has good thermal conductivity. This means that the submount must be formed of a material having a coefficient of thermal expansion close to that of the semiconductor element and having a high thermal conductivity. The submount disclosed in the above publication is formed of such a material. However, the material of this submount is composed of rare metal such as W or Mo, resulting in increased cost of the semiconductor device.

SUMMARY OF THE INVENTION

The present invention has been made to solve this problem. It is, therefore, an object of the present invention to provide a low-cost semiconductor device in which the semiconductor element has attached thereto a component formed of a material having a coefficient of thermal expansion close to that of the semiconductor element and having a high thermal conductivity.

The features and advantages of the present invention may be summarized as follows.

According to one aspect of the present invention, a semiconductor device includes a semiconductor element having a substrate formed of GaAs, InP, or GaN, and an element securing member bonded to the semiconductor element by solder and formed of a composite material of Cu and carbon material or a composite material of Al and carbon material.

Other and further objects, features and advantages of the invention will appear more fully from the following description.

DETAILED DESCRIPTION OF THE PREFERRED EMBODIMENTS

First Embodiment

Figure 1:
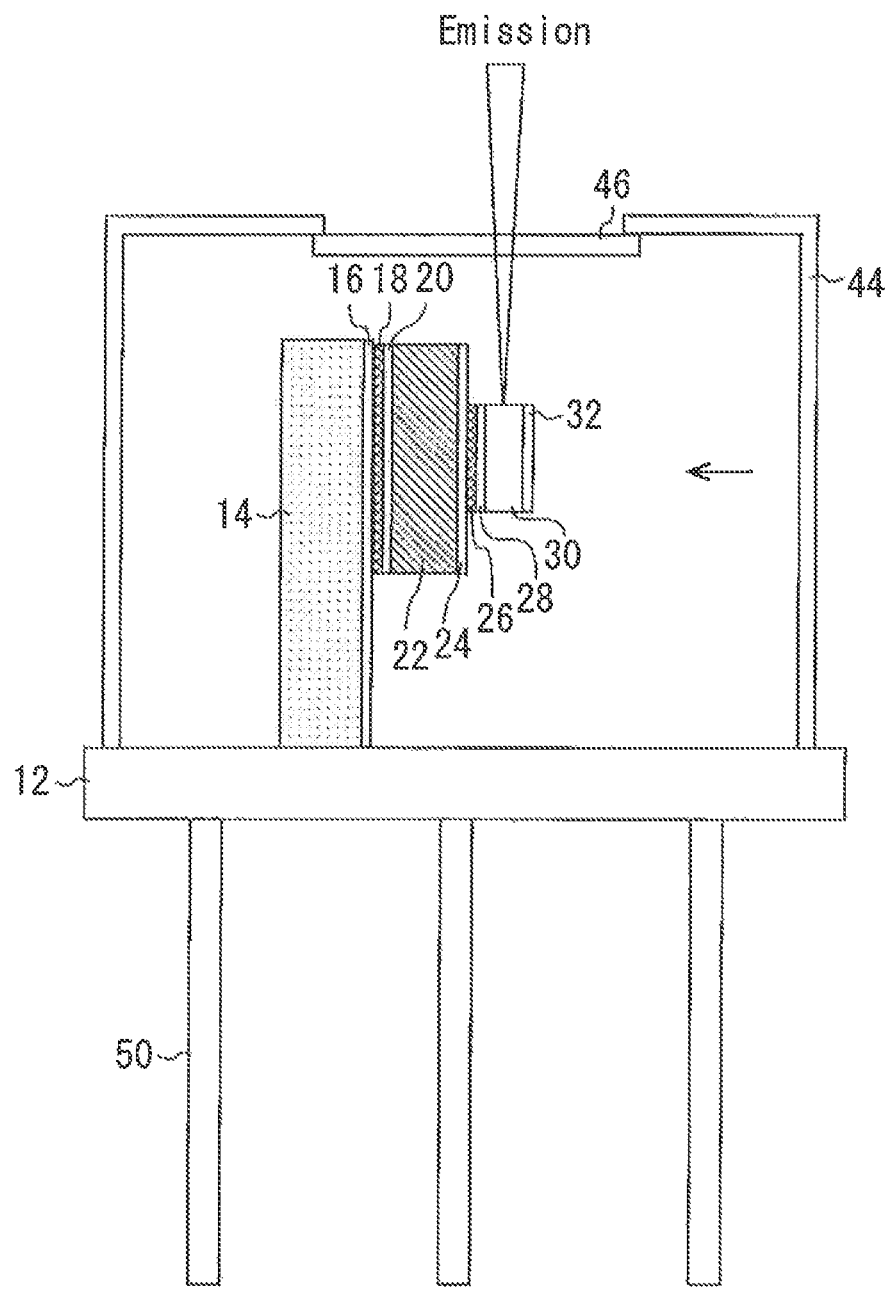
FIG. 1 is a cross-sectional view of a semiconductor device in accordance with a first embodiment of the present invention.

FIG. 1 is a cross-sectional view of a semiconductor device in accordance with a first embodiment of the present invention. The semiconductor device 10 of the first embodiment is configured as a CAN package. The semiconductor device 10 has a stem 12. A radiator block 14 is connected to the top of the stem 12. The radiator block 14 is formed of a material having good heat dissipation properties, such as Cu or Fe.

The radiator block 14 is connected to an element securing member 22 by solder 18. In order to facilitate this soldering, an Au layer 16 is formed on the surface of the radiator block 14, and an Au layer 20 is formed on the back surface of the element securing member 22. The solder 18 is interposed between the Au layers 16 and 20.

The element securing member 22 is formed of a composite material of Cu and carbon material, or a composite material of Al and carbon material. The element securing member 22 is formed to have a thickness of approximately a few tens to a few hundreds of microns, a length of approximately a few tens to a few thousands of microns, and a width of approximately a few hundreds to a few thousands of microns. For example, the element securing member 22 may be sized to have a thickness of approximately 200 µm, a length approximately equal to the semiconductor element length (i.e., approximately 500 µm), and a width of approximately 600 µm.

The element securing member 22 is soldered to a semiconductor element 30. The semiconductor element 30 is a light-emitting element having a substrate formed of GaAs, InP, or GaN. In order to facilitate the soldering, an Au layer 24 is formed on the front surface of the element securing member 22, and an Au layer 28 is formed on the surface of the semiconductor element 30 which faces the front surface of the element securing member 22. The solder, 26, is interposed between the Au layers 24 and 28. The solder 26 is, e.g., AuSn.

Figure 2:
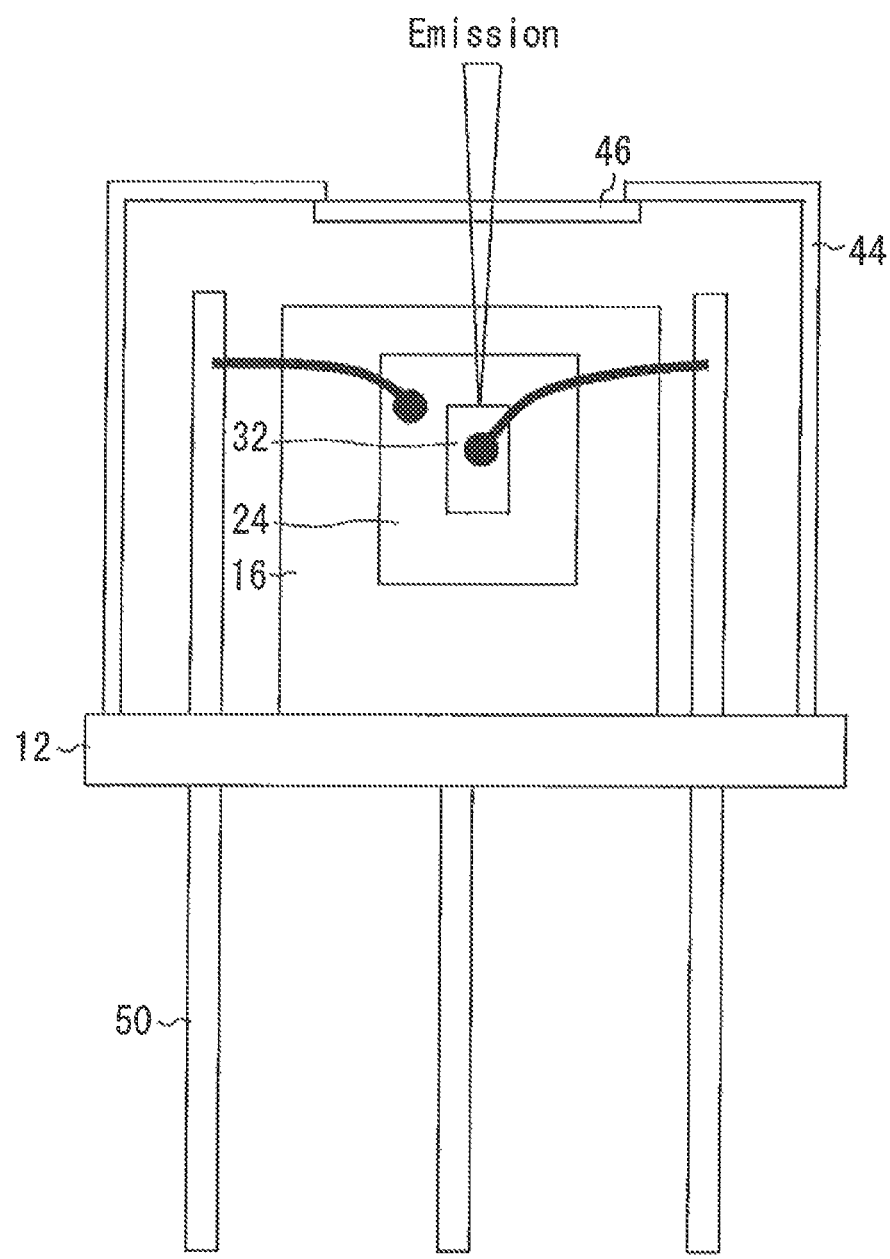
FIG. 2 is a view of the semiconductor device of FIG. 1 as viewed in the direction of the arrow.

An Au layer 32 is formed on the surface of the semiconductor element 30 opposite that adjacent the solder 26. The external electrical connection of the semiconductor element 30 will now be described. FIG. 2 is a view of the semiconductor device of FIG. 1 as viewed in the direction of the arrow. Two wires are connected respectively to the Au layer 24 and the Au layer 32 so as to allow external electrical connection of the semiconductor element 30. These wires are omitted from FIG. 1. Referring back to FIG. 1, a cap 44 is formed to cover the semiconductor element 30, the element securing member 22, and the radiator block 14. The cap 44 is secured to the stem 12. Glass 46 is formed at the top of the cap 44. Further, leads 50 extend downward from the stem 12.

When the element securing member 22 and the semiconductor element 30 are bonded together by the solder 26, the element securing member 22 and the semiconductor element 30 are subjected to a high temperature (e.g., approximately 280° C.) at the time of fusion of the solder 26. Therefore, in order to prevent the semiconductor element 30 from being subjected to excessive stress, the element securing member 22 and the semiconductor element 30 must have substantially equal coefficients of thermal expansion.

The coefficient of thermal expansion of the semiconductor element 30, which has a GaAs substrate, is $5.7 \times 10^{-6}/°$ C. Since the element securing member 22 of the first embodiment is formed of a composite material of Cu and carbon material or a composite material of Al and carbon material, the coefficient of thermal expansion of the element securing member 22 can be varied in the range of approximately $5 \times 10^{-6}/°$ C. to $15 \times 10^{-6}/°$ C. by adjusting its composition. This means that it is possible to substantially equalize the coefficient of thermal expansion of the element securing member 22 with that of the semiconductor element 30.

In addition, the thermal conductivity of the element securing member 22 is 450 W/mK or more, which is considered to be very high since the material (namely, AlN) that has been used to form conventional submounts has a thermal conductivity of 200 W/mK. Therefore, the use of the element securing member 22 enhances the heat dissipation from the semiconductor element 30. As a result, the semiconductor element 30 can even be configured as a 638 nm high-output LD, which generates a significantly large amount of heat.

The element securing member 22 is low cost, since it is made of Cu (or Al) and carbon material, all of which are widely used industrial materials. Therefore, the element securing member 22 is lower in cost than submounts (or element securing members) formed of rare metal such as Mo or W (such a submount being disclosed in the above-cited publication).

The composite material used to form the element securing member 22 may be a metal-carbon fiber composite material obtained by sintering Cu and carbon fiber or by sintering Al and carbon fiber. The carbon fiber may be selected from the group consisting of pitch-based carbon fiber, PAN-based carbon fiber, vapor grown carbon fiber, carbon nanotube, and nanotube/nanofiber twisted wire. However, the composite material can be any composite material of Cu and carbon material, or any composite material of Al and carbon material, having a coefficient of thermal expansion substantially equal to that of the semiconductor element and having a high thermal conductivity.

The radiator block 14 may be formed of the same material as the element securing member 22. Such a radiator block (formed of a composite material of Cu and carbon material or a composite material of Al and a carbon material) has a higher thermal conductivity than a radiator block of Cu, making it possible to enhance the heat dissipation from the semiconductor element 30.

Various other alterations may be made to the semiconductor device of the first embodiment. For example, the semiconductor element 30 is not limited to light-emitting devices, but may be configured as a photodetector. Further, the semiconductor element 30 is not even limited to optical devices (such as light-emitting devices and photodetectors), but may be a high frequency device (MMIC, HEMT, HBT).

Second Embodiment

Figure 3:
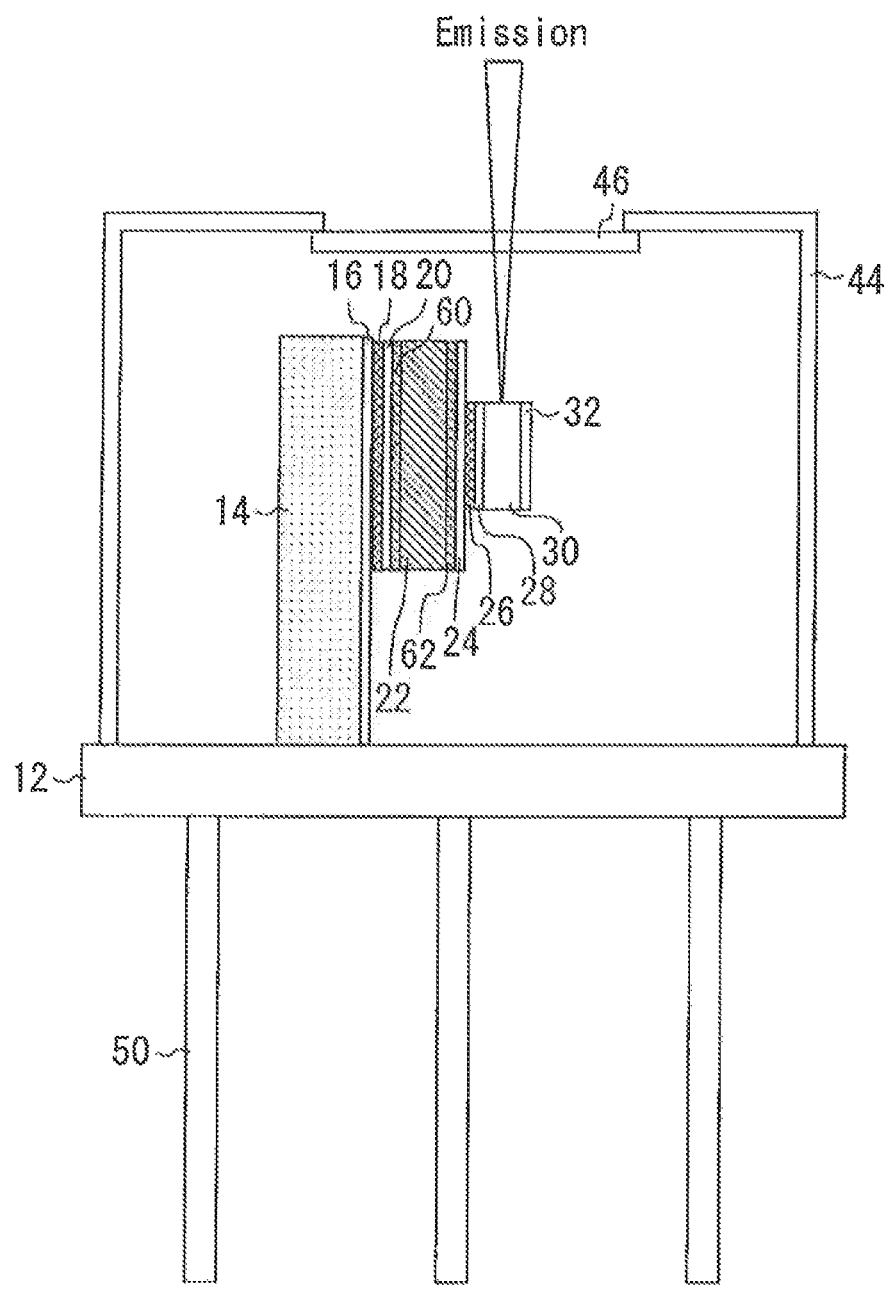
FIG. 3 is a cross-sectional view of a semiconductor device in accordance with a second embodiment of the present invention.

FIG. 3 is a cross-sectional view of a semiconductor device in accordance with a second embodiment of the present invention. The following description of the second embodiment will be primarily limited to the differences from the first embodiment. The semiconductor device of the second embodiment is characterized by having barrier metal layers 60 and 62 for preventing the counter diffusion between Cu (or Al) in the element securing member 22 and Au in the Au layers 20 and 24.

The barrier metal layers 60 and 62, which are made of Ti or Pt, are formed on the back and front surfaces, respectively, of the element securing member 22. The Au layers 20 and 24 are formed on the surfaces of the barrier metal layers 60 and 62, respectively.

Since the element securing member 22 contains Cu (or Al), if the element securing member 22 is in contact with the Au layers 20 and 24, a counter diffusion may occur whereby Cu (or Al) diffuses from the element securing member 22 into the Au layers 20 and 24 and Au diffuses from the Au layers 20 and 24 into the element securing member 22. Particularly, in the case where the semiconductor element 30 and the element securing member 22 are connected together by the solder 26, the semiconductor element 30 and the element securing member 22 are subjected to a high temperature at the time of fusion of the solder 26, which increases the likelihood of occurrence of the counter diffusion. The counter diffusion might cause a change in the coefficient of thermal expansion and in the thermal conductivity of the element securing member 22.

In the semiconductor device of the second embodiment, on the other hand, the barrier metal layers 60 and 62 prevent this counter diffusion. It should be noted that the semiconductor device of the second embodiment is susceptible of alterations at least similar to those that can be made to the semiconductor device of the first embodiment.

Third Embodiment

Figure 4:
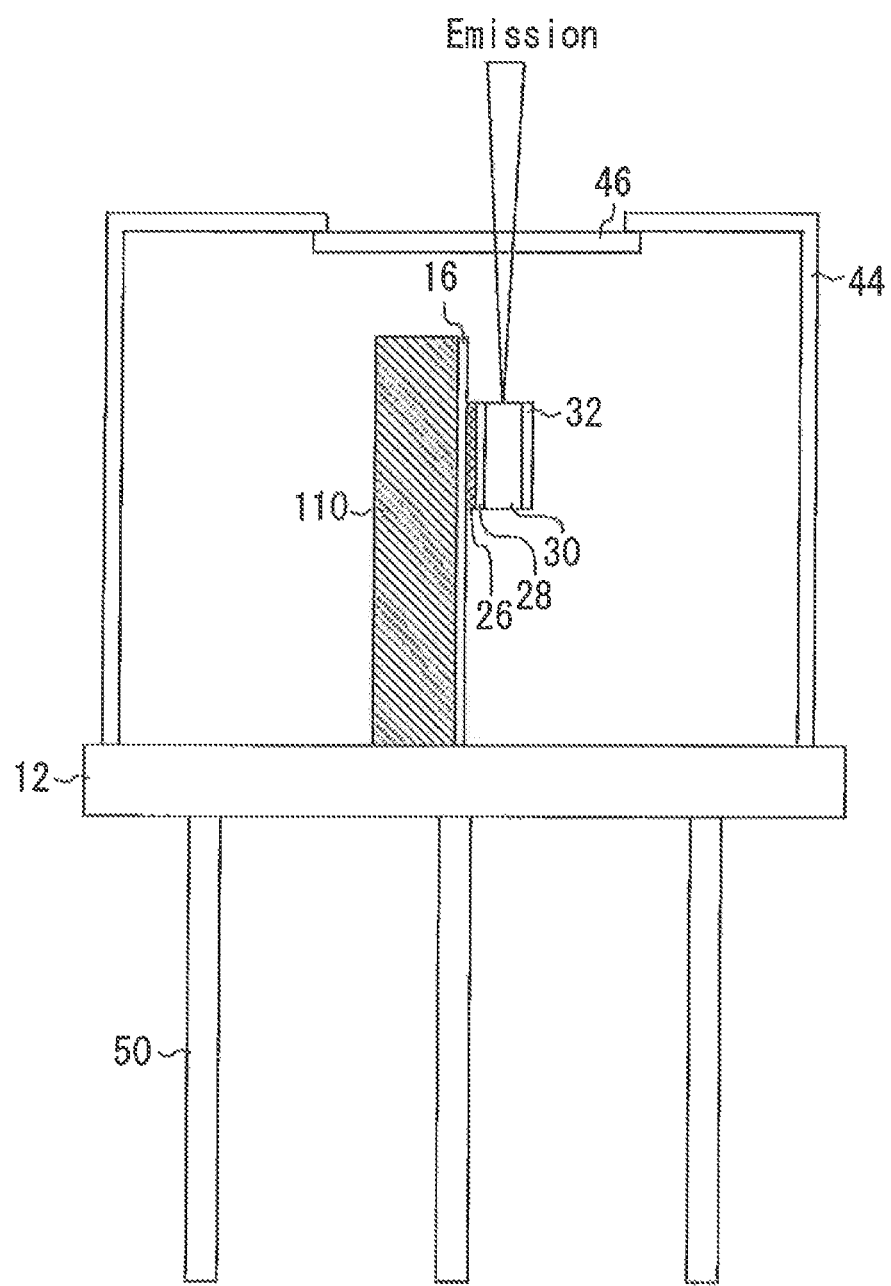
FIG. 4 is a cross-sectional view of a semiconductor device in accordance with a third embodiment of the present invention.

FIG. 4 is a cross-sectional view of a semiconductor device in accordance with a third embodiment of the present invention. The following description of the third embodiment will be primarily limited to the differences from the first embodiment. The semiconductor device of the third embodiment is characterized by including, instead of the element securing member 22 and the radiator block 14, an element securing member 110 which is secured to the stem 12.

The element securing member 110 is of large size and, like the element securing member 22 described above, has an adequately high thermal conductivity, eliminating the need for a radiator block. Therefore, the element securing member 110 is directly connected to the stem 12. In this case, the cap 44 covers the semiconductor element 30 and the element securing member 110. The element securing member 110 functions both to reduce stress on the semiconductor element 30 and to discharge heat from the semiconductor element 30. Therefore, in this semiconductor device, the element securing member 110 is directly connected to the stem 12, thus simplifying the construction of the semiconductor device.

Figure 5:
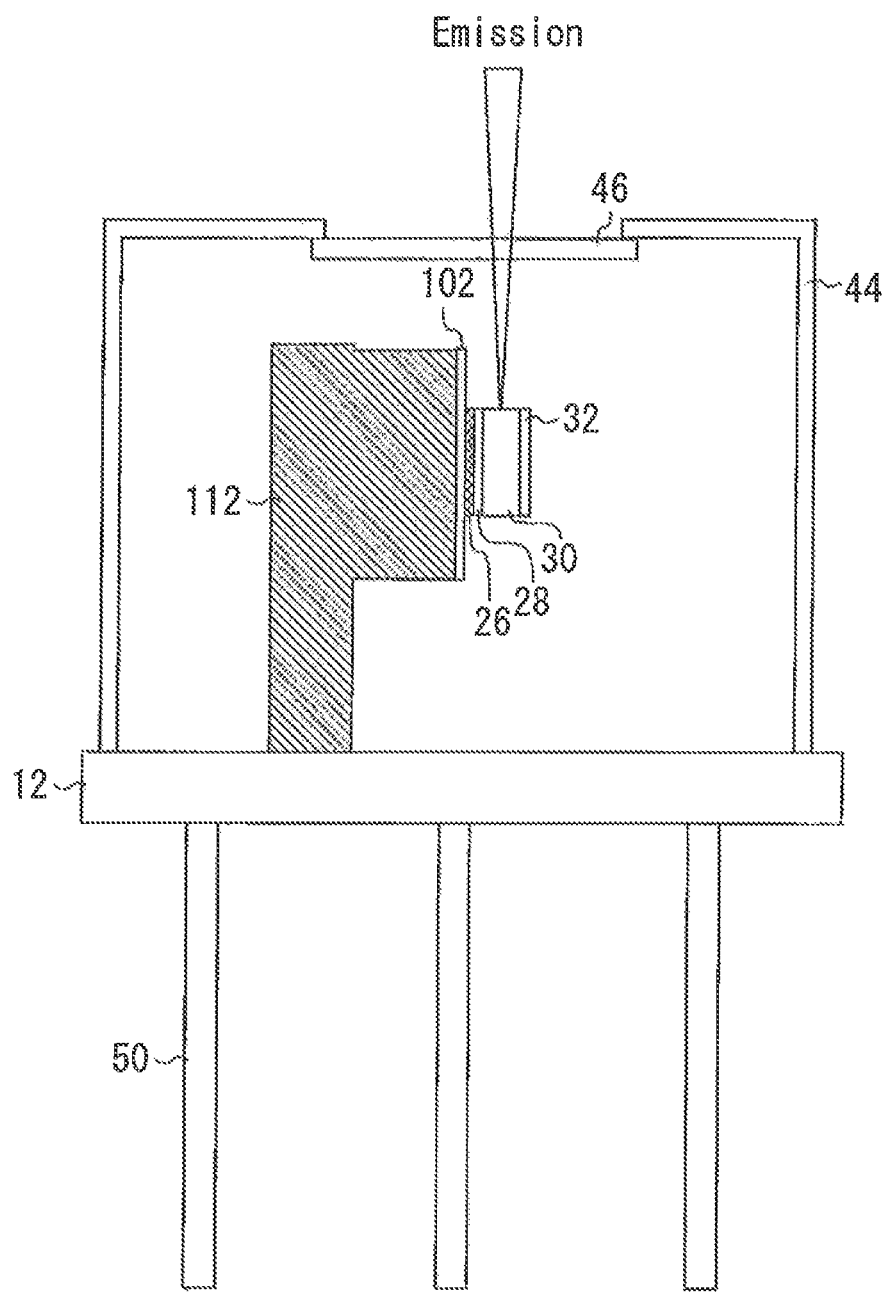
FIG. 5 is a cross-sectional view of a variation of the semiconductor device of the third embodiment.

FIG. 5 is a cross-sectional view of a variation of the semiconductor device of the third embodiment. As shown in FIG. 5, this semiconductor device differs from that of the first embodiment in that the element securing member (or submount) 22 and the radiator block 14 shown in FIG. 1 are replaced by an element securing member 112 which is made up of a submount portion and a radiator block portion integrally formed with each other. It should be noted that the semiconductor device of the third embodiment is susceptible of alterations at least similar to those that can be made to the semiconductor device of the first embodiment.

Fourth Embodiment

Figure 6:
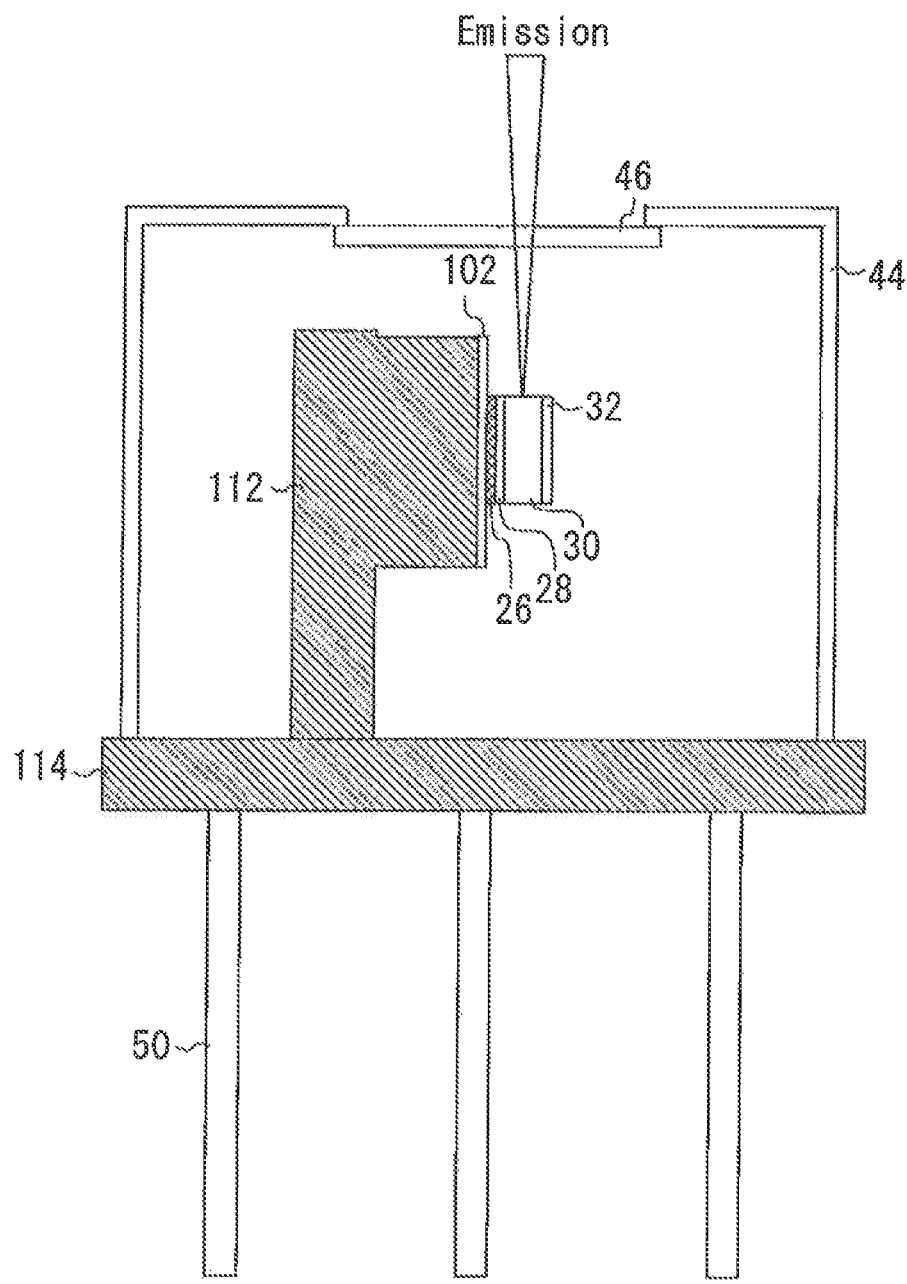
FIG. 6 is a cross-sectional view of a semiconductor device in accordance with a fourth embodiment of the present invention.

FIG. 6 is a cross-sectional view of a semiconductor device in accordance with a fourth embodiment of the present invention. The following description of the fourth embodiment will be primarily limited to the differences from the first embodiment. The semiconductor device of the fourth embodiment includes an element securing member 112 and a stem 114 connected to the element securing member 112. This semiconductor device is further characterized in that the stem 114 is formed of a composite material.

Figure 7:
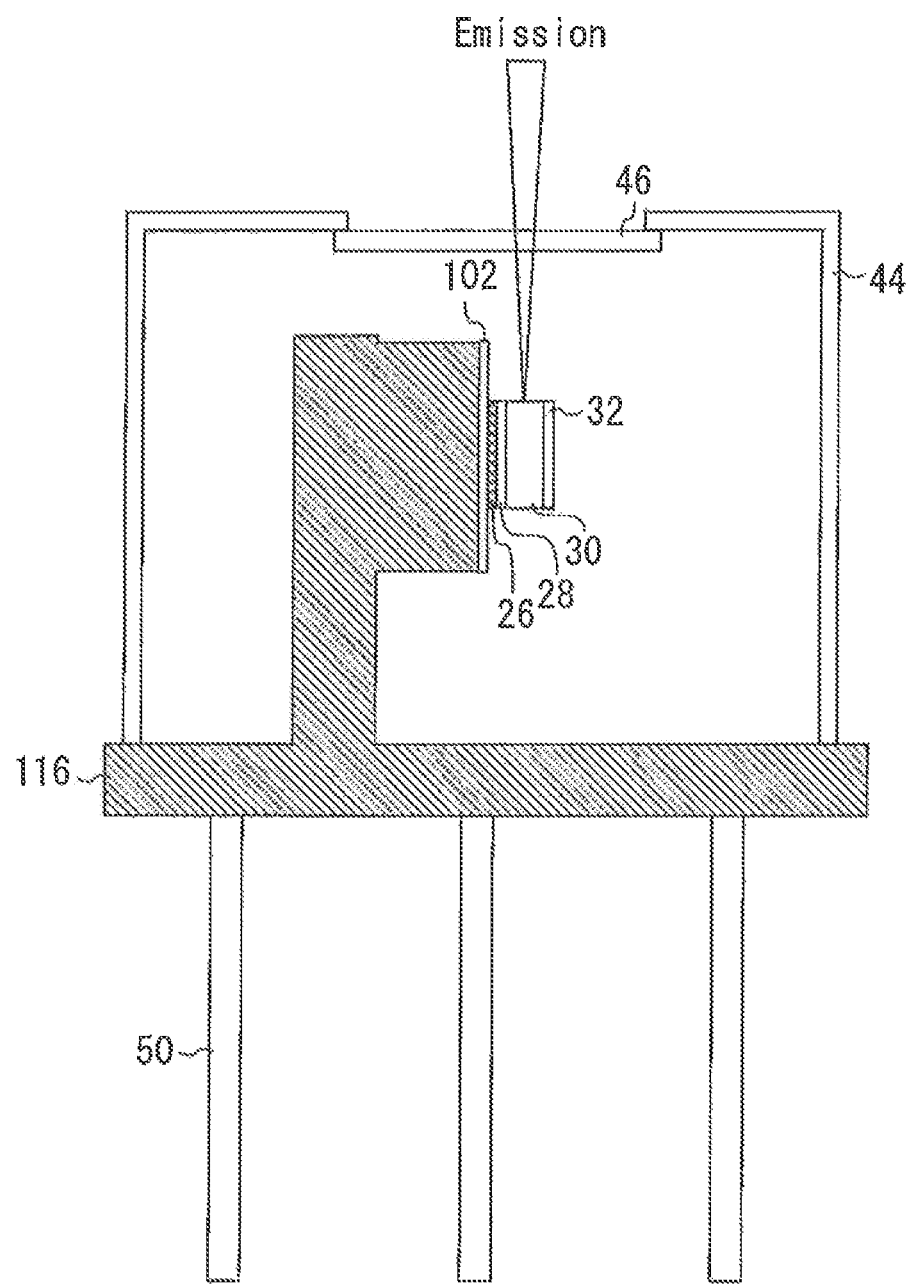
FIG. 7 is a cross-sectional view of a variation of the semiconductor device of the fourth embodiment.

The stem 114 is formed of the same material as the element securing member 112. This enhances the heat dissipation from the semiconductor device 30, as compared with cases in which the stem is formed of Cu. FIG. 7 is a cross-sectional view of a variation of the semiconductor device of the fourth embodiment. This semiconductor device is characterized by having a stem 116 made up of a stem portion and an element securing member portion which correspond to the stem and the element securing member, respectively, shown in FIG. 6 and which are integrally formed of the same material. This simplifies the assembly process.

The semiconductor device of the fourth embodiment is susceptible of alterations at least similar to those that can be made to the semiconductor device of the first embodiment. Further, for example, the stem 12 shown in FIG. 4 may be formed of a composite material.

Fifth Embodiment

Figure 8:
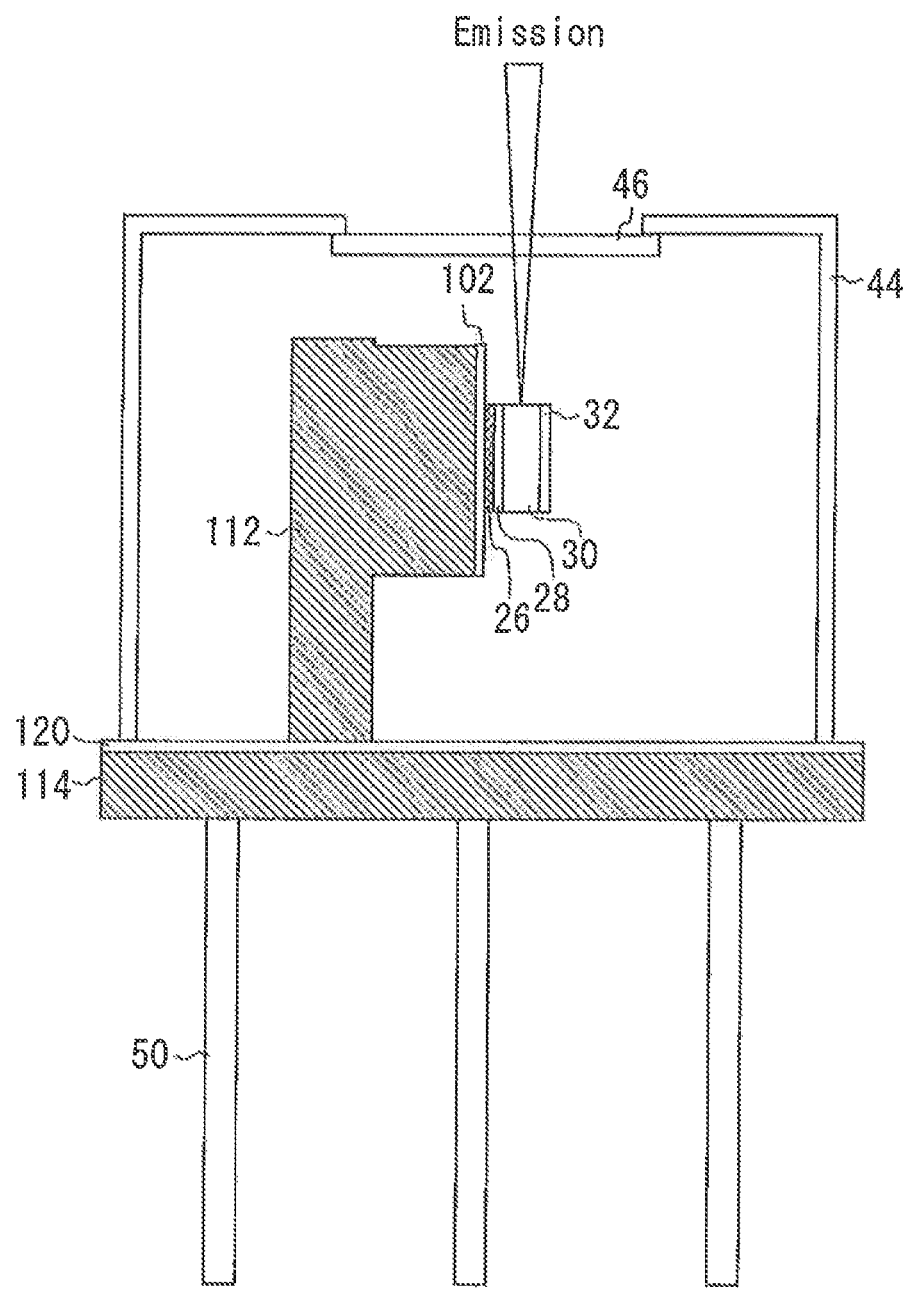
FIG. 8 is a cross-sectional view of a semiconductor device in accordance with a fifth embodiment of the present invention.

FIG. 8 is a cross-sectional view of a semiconductor device in accordance with a fifth embodiment of the present invention. The following description of the fifth embodiment will be primarily limited to the differences from the fourth embodiment. The semiconductor device of the fifth embodiment is characterized in that the stem 114 has an iron layer 120 formed on its surface. The cap 44 is secured to the stem 114 by being welded to the iron layer 120.

In order to directly weld the cap 44 and the stem 114 together, it is necessary to heat the stem 114 to a high temperature. However, it is difficult to adequately heat the stem 114, since it is formed of a composite material having a high thermal conductivity, meaning that it is difficult to directly weld the stem 114 and the cap 44 together. Therefore, in this semiconductor device, the iron layer 120 is provided on the surface of stem 114, and the cap 44 is welded to the iron layer 120, thereby solving the above problem.

Figure 9:
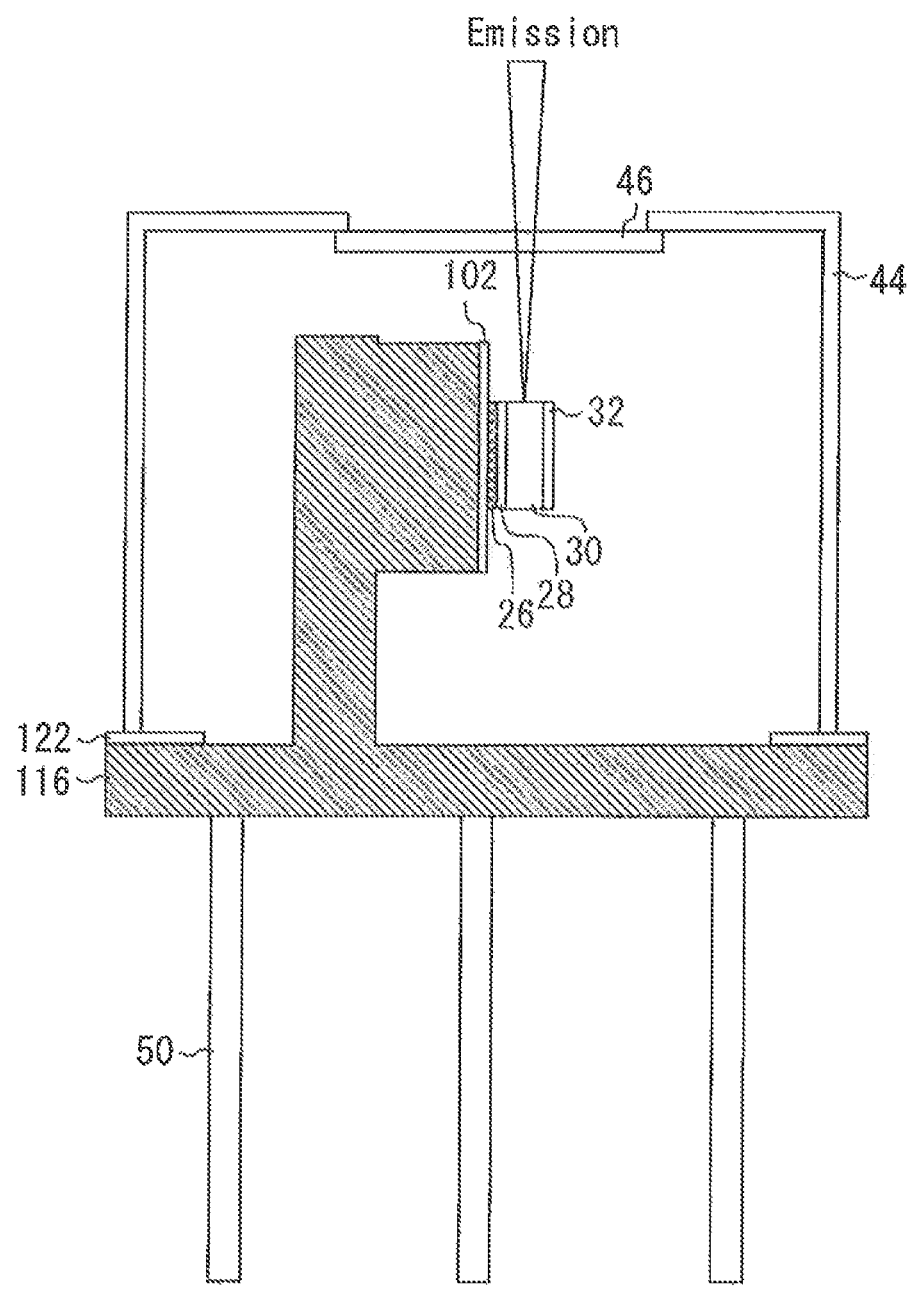
FIG. 9 is a cross-sectional view of a variation of the semiconductor device of the fifth embodiment.

FIG. 9 is a cross-sectional view of a variation of the semiconductor device of the fifth embodiment. In this semiconductor device, an iron layer 122 is formed on the surface of a stem 116 only in areas where the cap 44 is welded to the stem 116. It should be noted that the semiconductor device of the fifth embodiment is susceptible of alterations at least similar to those that can be made to the semiconductor device of the first embodiment.

Sixth Embodiment

Figure 10:
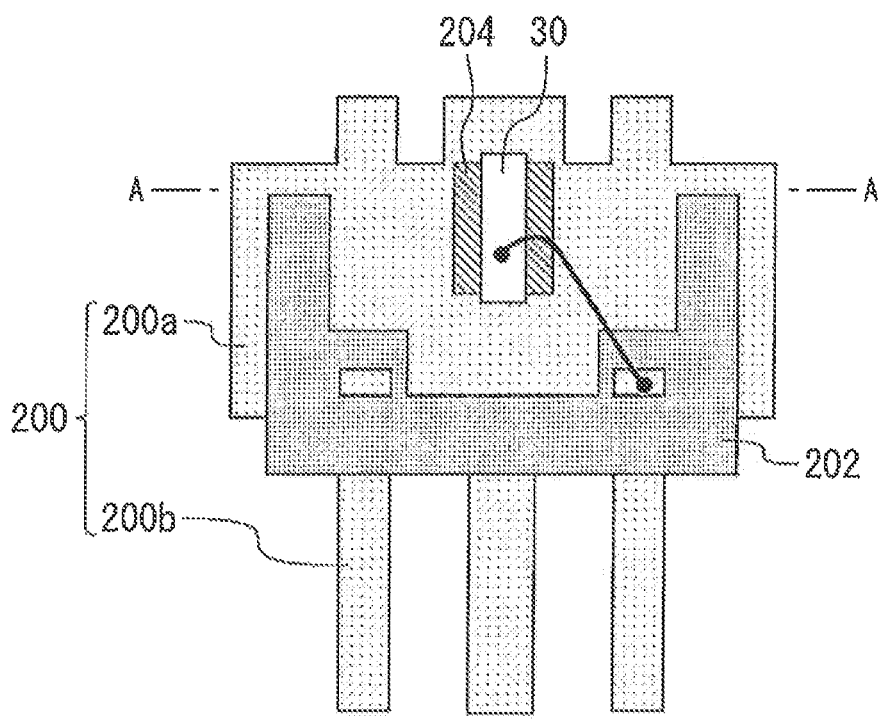
FIG. 10 is a cross-sectional view of a semiconductor device in accordance with a sixth embodiment of the present invention.

FIG. 10 is a cross-sectional view of a semiconductor device in accordance with a sixth embodiment of the present invention. A frame 200 has a frame portion 200a and lead portions 200b. A resin mold 202 is formed on the frame 200. An element securing member 204 is secured to the frame portion 200a. The element securing member 204 is formed of the same material as the element securing member 22 of the first embodiment. The semiconductor element 30 is connected to the surface of the element securing member 204 by solder.

Figure 11:
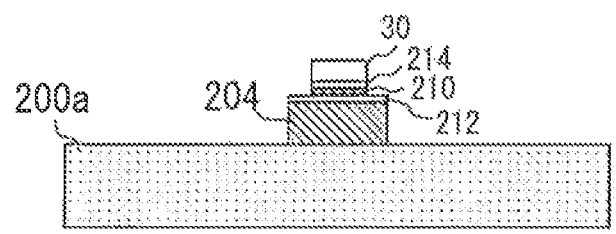
FIG. 11 is a cross-sectional view taken along line A-A of FIG. 10.

FIG. 11 is a cross-sectional view taken along line A-A of FIG. 10. Solder 210 is provided between an Au layer 212 formed on the surface of the element securing member 204 and an Au layer 214 formed on the surface of the semiconductor element 30 which faces the surface of the element securing member 204.

Thus, an element securing member in accordance with the present invention may be used in a semiconductor device of the type which uses a frame such as the frame 200. Further, the frame 200 may be formed of a composite material in order to further enhance the heat dissipation from the semiconductor element. Further, the frame 200 and the element securing member 204 may be integrally formed with each other. It should be noted that the semiconductor device of the sixth embodiment is susceptible of alterations at least similar to those that can be made to the semiconductor device of the first embodiment.

It should be further noted that in each of the semiconductor devices of the first to sixth embodiments, the upward position of the semiconductor element relative to the element securing member is arbitrary; either of them can project upward from the other. In the examples presented in connection with the first to fifth embodiments, the element securing member projects upward from the semiconductor element 30. In the example presented in connection with the sixth embodiment, on the other hand, the semiconductor element 30 projects upward from the element securing member.

In accordance with the present invention, a semiconductor element is soldered to an element securing member formed of a composite material of Cu and carbon material, or a composite material of Al and carbon material, making it possible to provide a low-cost semiconductor device having good heat dissipation properties in which the semiconductor element is not subjected to excessive stress.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-108513, filed on May 10, 2012, including specification, claims, drawings, and summary, on which the Convention priority of the present application is based, is incorporated herein by reference in its entirety.

What is claimed is:

1. A semiconductor device comprising:
    a semiconductor element having a substrate of one of GaAs, InP, and GaN;
    an element securing member bonded to said semiconductor element by solder, wherein said element securing member is composed of a composite of Cu and carbon;
    a stem connected to said element securing member; and
    a cap secured to said stem and covering said semiconductor element, and said element securing member, wherein said stem and said element securing member are the same material.

2. The semiconductor device according to claim 1, wherein said stem and said element securing member are integral.

3. The semiconductor device according to claim 1, further comprising an iron layer on a surface of said stem, wherein said cap is welded to said iron layer and thereby secured to said stem.

4. A semiconductor device comprising:
    a semiconductor element having a substrate of one of GaAs, InP, and GaN;
    an element securing member bonded to said semiconductor element by solder, wherein said element securing member is composed of a composite of Al and carbon;
    a stem connected to said element securing member; and a cap secured to said stem and covering said semiconductor element, and said element securing member, wherein said stem and said element securing member are the same material.

5. The semiconductor device according to claim 4, wherein said stem and said element securing member are integral.

6. The semiconductor device according to claim 4, further comprising an iron layer on a surface of said stem, wherein said cap is welded to said iron layer and thereby secured to said stem.

* * * * *